(12) United States Patent
Kim et al.

(10) Patent No.: US 9,736,919 B2
(45) Date of Patent: Aug. 15, 2017

(54) RF POWER DISTRIBUTION DEVICE AND RF POWER DISTRIBUTION METHOD

(71) Applicant: Plasmart, Inc., Daejeon (KR)

(72) Inventors: Jaehyun Kim, Daejeon (KR); Sang Won Lee, Daejeon (KR); Yong Gwan Lee, Daejeon (KR)

(73) Assignee: PLASMART, INC., Daejeon (KR)

( * ) Notice: Subject to any disclaimer, the term of this patent is extended or adjusted under 35 U.S.C. 154(b) by 948 days.

(21) Appl. No.: 13/750,058

(22) Filed: Jan. 25, 2013

(65) Prior Publication Data

US 2013/0134877 A1    May 30, 2013

Related U.S. Application Data

(63) Continuation of application No. PCT/KR2011/002951, filed on Apr. 22, 2011.

(30) Foreign Application Priority Data

Jul. 30, 2010   (KR) ........................ 10-2010-0073805

(51) Int. Cl.
*C23C 14/34*   (2006.01)
*H05H 1/46*   (2006.01)
(Continued)

(52) U.S. Cl.
CPC ......... *H05H 1/46* (2013.01); *H01J 37/32091* (2013.01); *H01J 37/32183* (2013.01);
(Continued)

(58) Field of Classification Search
CPC ................. H01J 37/32091; H01J 37/32183
See application file for complete search history.

(56) References Cited

U.S. PATENT DOCUMENTS 5,053,725 A * 10/1991 Gesche .................... H03H 7/40
                                                      333/17.3
6,677,711 B2    1/2004 MacGearailt
(Continued)

FOREIGN PATENT DOCUMENTS

CN    1577730 A    2/2005
CN    1957437 A    5/2007
(Continued)

OTHER PUBLICATIONS

International Search Report for Application No. PCT/CN 2009/074532 dated Jan. 15, 2010.
(Continued)

*Primary Examiner* — Jason M Berman
(74) *Attorney, Agent, or Firm* — Jenkins, Wilson, Taylor & Hunt P.A.

(57) ABSTRACT

Provided are an RF power distribution device and an RF power distribution method. The RF power distribution device includes an impedance matching network for transferring power from an RF power source and a power distribution unit for distributing the output power from the impedance matching network to at least one electrode generating capacitively-coupled plasma. The power distribution unit includes a first reactive element connected in series to a first electrode, a variable capacitor having one end connected in parallel to the first reactive element and the first electrode and the other end grounded, and a second reactive element having one end connected to a first node where the one end of the variable capacitor and one end of the first reactance device are in contact with each other and the other end connected to a second node where a second electrode and an output terminal of the impedance matching network are connected.

14 Claims, 20 Drawing Sheets

(51) Int. Cl.
*H01J 37/32* (2006.01)
*H03H 7/40* (2006.01)

(52) U.S. Cl.
CPC ....... *H03H 7/40* (2013.01); *H05H 2001/4675* (2013.01); *H05H 2001/4682* (2013.01)

(56) References Cited

U.S. PATENT DOCUMENTS

| | | | |
|---|---|---|---|
| 1,957,437 | A1 | 10/2007 | Dhindsa et al. |
| 7,276,135 | B2 * | 10/2007 | Dhindsa ............ H01J 37/32165 118/723 E |
| 7,442,273 | B2 | 10/2008 | Kwon et al. |
| 2005/0031796 | A1 * | 2/2005 | Wu .................. H01J 37/32082 427/569 |
| 2005/0269292 | A1 * | 12/2005 | Koshiishi .......... H01J 37/32027 216/67 |

FOREIGN PATENT DOCUMENTS

| | | |
|---|---|---|
| CN | 1961402 B | 5/2013 |
| JP | 07-086238 | 3/1995 |
| JP | 2001/144079 A | 5/2001 |
| JP | 2001-267098 | 9/2001 |
| JP | 2010-021404 | 1/2010 |
| KR | 10-2005-0122134 A | 12/2005 |
| KR | 10-2007-0112662 A | 11/2007 |
| WO | WO 02-084698 A1 | 10/2002 |
| WO | WO-2010/066151 A1 | 6/2010 |

OTHER PUBLICATIONS

International Search Report for PCT/KR2011/002951 dated Jan. 2, 2012.

* cited by examiner

RF POWER DISTRIBUTION DEVICE AND RF POWER DISTRIBUTION METHOD

CROSS-REFERENCE TO RELATED APPLICATIONS

This application is a continuation of and claims priority to PCT/KR2011/002951 filed on Apr. 22, 2011, which claims priority to Korea Patent Application No. 10-2010-0073805 filed on Jul. 30, 2010, the entireties of which are both hereby incorporated by reference.

BACKGROUND OF THE INVENTION

1. Field of the Invention

The present invention relates to RF power distribution devices and, more particularly, to an RF power distribution device for distributing RF power impedance-matched by a single matching network to a plurality of electrodes or a plurality of positions of an electrode.

2. Description of the Related Art

A capacitively-coupled RF plasma device a top electrode, a source RF power source, a substrate holder for retaining a substrate, and a bias RF power source which are disposed inside a vacuum container. The source RF power source is applied to the top electrode, and the bias RF power source is applied to the substrate holder. However, when the source RF power source and the bias RF power source use the same frequency, mutual interference makes it difficult to stably perform a plasma process. In another type of a capacitively-coupled RF plasma device, an RF power source is applied to only one of a top electrode and a substrate holder inside a vacuum container. Unfortunately, there is no suitable power distribution means when an electrode is divided into a plurality of electrodes to adjust uniformity or power is applied to one electrode at a plurality of positions.

SUMMARY OF THE INVENTION

Embodiments of the present invention provide a power distribution device for simultaneously or sequentially generating capacitively-coupled plasmas through power distribution. In an example embodiment, the power distribution device may include an impedance matching network configured to deliver power from an RF power source; and a power distribution unit configured to distribute the output power from the impedance matching network to at least one electrode generating capacitively-coupled plasma. The power distribution unit may include a first reactive element connected in series to a first electrode; a variable capacitor having one end connected in parallel to the first reactive element and the first electrode and the other end grounded; and a second reactive element having one end connected to a first node where the one end of the variable capacitor and one end of the first reactive element are in contact with each other and the other end connected to a second node where a second electrode and an output terminal of the impedance matching network are connected.

Embodiments of the present invention provide a power distribution method for simultaneously or sequentially generating capacitively-coupled plasmas through power distribution. In an example embodiment, the power distribution method may include setting first power, a first voltage, or a first current flowing to a first electrode disposed inside a vacuum container to generate capacitively-coupled plasma and setting second power, a second voltage, or a second current supplied to a second electrode disposed inside the vacuum container; supplying power to the first electrode and the second power from an RF power source through an impedance matching network; performing matching by operating the impedance matching network; measuring at least one of the current, the voltage, and the power flowing through the first electrode and the second electrode; and controlling the set power, the set voltage or the set current to be supplied to the first electrode and the second electrode by using a power distribution unit.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Figure 1:
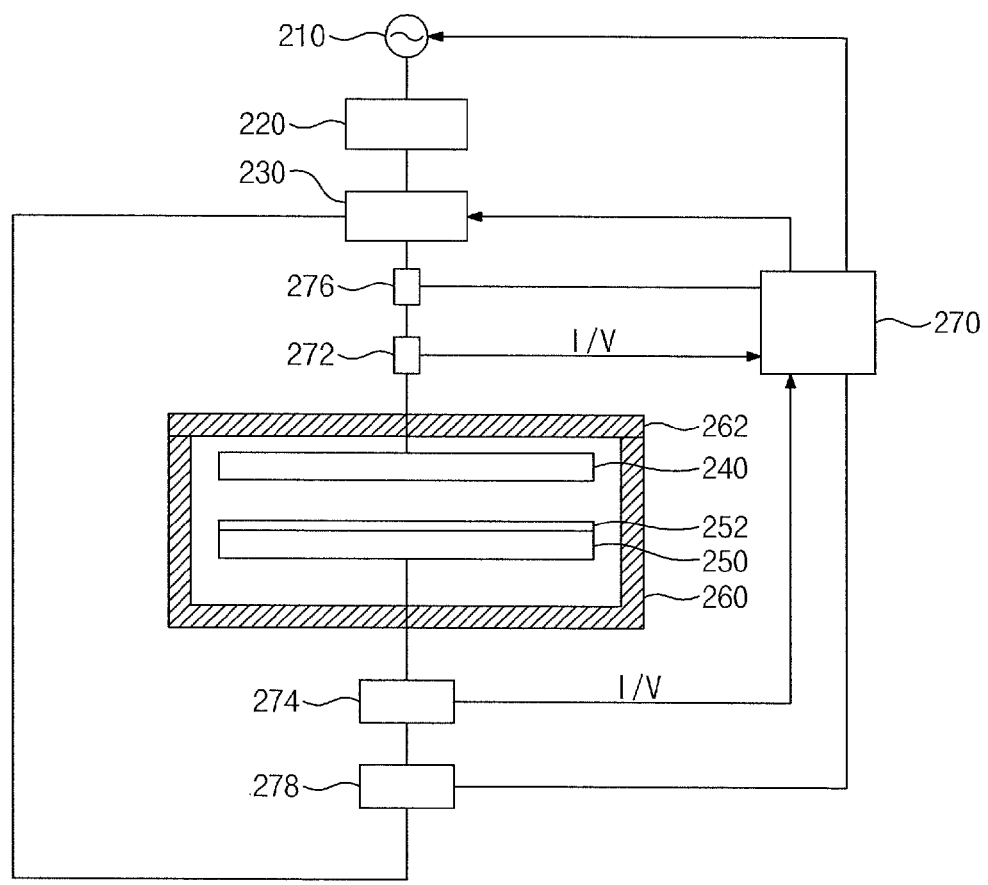
FIGS. 1 and 2 illustrate a power distribution device according to embodiments of the present invention.

Capacitively-coupled plasma has been widely used in deposition of polysilicon for solar cells, etching of oxide layers, and the like. However, the problem of plasma space uniformity or cleaning has emerged as substrates trend to become larger in diameter. If frequencies of RF power sources are identical to each other when the RF power sources supply power to a plurality of electrodes respectively, mutual interference of the RF power sources causes difficulty in impedance matching. Hence, there is a requirement for a power distribution device that efficiently and stably distributes power to electrodes.

According to an embodiment of the present invention, a power distribution device may distribute power to a plurality of electrodes or supply power to an electrode at a plurality of positions. When the electrodes are disposed on the same plane, the power distribution device may enhance plasma uniformity or process uniformity. When the electrodes are disposed on the different plane, the power distribution device may distribute power to the plurality of electrodes from an RF power source to generate plasma. The power distribution device may employ a single impedance matching network to simplify the configuration of a system.

In a power distribution device according to an embodiment of the present invention, an impedance matching network disposed between an RF power source and a power distribution unit performs impedance matching. In this case, an impedance viewing the power distribution unit from an output terminal of the impedance matching network is comparatively constant irrespective of variable reactance of a power distribution unit. That is, an impedance viewing the power distribution unit from an output terminal of the impedance matching network is slightly affected by the power distribution unit. Thus, the impedance matching network may perform stable impedance matching, process stability and reliability may be improved. Also, the power distribution unit is linearly varied depending on the capacity of a variable element and has a wide power distribution ratio within the variable range of the variable element.

Hereinafter, embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In embodiments, well-known processes, well-known device structures, and well-known techniques will not be described in detail to avoid ambiguous interpretation of the present invention. Like reference numerals refer to like elements throughout.

Figure 2:
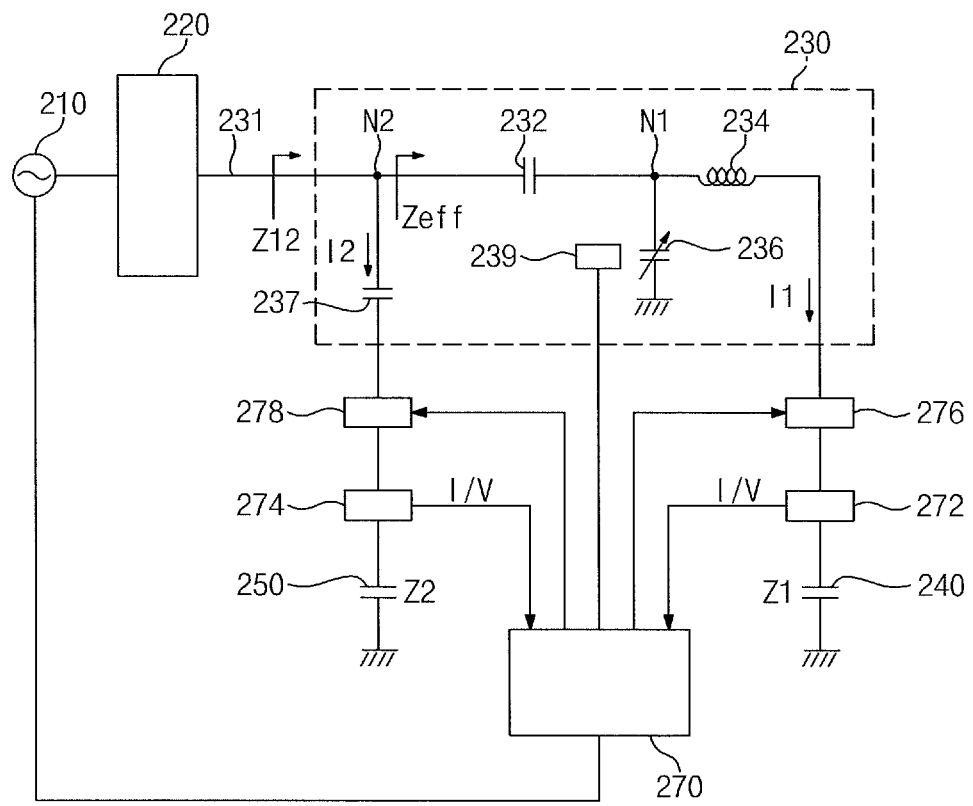

FIGS. 1 and 2 illustrate a power distribution device according to embodiments of the present invention.

Referring to FIGS. 1 and 2, the power distribution device includes an impedance matching network 220 delivering power of an RF power source 210 and a power distribution unit 230 distributing output power of the impedance matching network 220 to at least one of first and second electrodes 240 and 250 generating capacitively-coupled plasma.

The power distribution unit 230 includes a first reactive element 234 connected in series to the first electrode 240, a variable capacitor 236 having one end connected in parallel to the first reactive element 234 and the first electrode 240 and the other end ground, and a second reactive element 232 having one end connected to a first node N1 where the one end of the variable capacitor 236 and one end of the first reactive element 234 are in contact with each other and the other end connected to a second node N2 where the second electrode 250 and an output terminal 231 of the impedance matching network 220 are connected.

The RF power source 210 may output a sine wave of a single frequency and the frequency may be about 0.1 MHz to about 20 MHz. The impedance matching network 220 may be means for maximally delivering power to a load.

A vacuum chamber 260 may be made of a metallic material, and the lid 262 of the vacuum container 260 may be a metal plate.

The first electrode 240 and the second electrode 250 may be disposed opposite to each other. A substrate 252 may be mounted on the second electrode 250. The first electrode 240 may generate capacitively-coupled plasma. The first electrode 240 may include gas distribution means. The first electrode 240 may receive power through the power distribution unit 230.

The second electrode 250 may generate capacitively-coupled plasma and apply a bias voltage to the substrate 252.

The second electrode 250 may be a substrate holder. The substrate 252 may be a semiconductor substrate or a glass substrate.

A first measuring unit 272 may measure at least one of power, current, and voltage of the first electrode 240. A second measuring unit 274 may measure at least one of power, current, and voltage of the second electrode 250. The first and second measuring units 272 and 274 may include a pick-up coil for measuring current flowing to the first and second electrode 240 and 250 a voltage measuring electrode for measuring a voltage.

A controller 270 may receive outputs of the first measuring unit 272 and the second measuring unit 274 and control the power distribution unit 230 and the RF power source 210 to control a ratio of powers or currents flowing to the first electrode 240 and the second electrode 250. The controller 270 may control the power distribution unit 230 and/or the RF power source 210 by calculating power, voltage or current flowing to the first electrode 240 and/or the second electrode 250. Thus, the first electrode 240 and the second electrode 250 may receive set power, voltage or current. That is, the controller 270 may supply not only comparatively power distributed to the first electrode 240 and the second electrode 250 but also an absolute value supplied to the first electrode 240 and the second electrode 250. The power supplied to the second electrode 250 may decide a DC bias voltage.

Switches 276 and 278 may be directly connected to at least one of the first and second electrodes 240 and 250. The switches 276 and 278 may switch the power supplied to the first electrode 240 or the second electrode 250. Each of the switches 276 and 278 may be a mechanical relay switch using solenoid or an electrical switch using a pin diode.

The first reactive element 234 is an inductor, and the second reactive element 232 is a fixed capacitor. An auxiliary capacitor 237 may be provided between the second electrode 250 and the second node N2. The auxiliary capacitor 237 may be used to adjust a phase between the first electrode 240 and the second electrode 250. The auxiliary electrode 237 may be a variable capacitor to which a motor is connected. The auxiliary electrode 237 may serve to adjust a phase between the first electrode 240 and the second electrode 250 within a certain range.

The variable capacitor 236 may be a vacuum capacitor. The vacuum capacitor may be connected to the motor 239 to vary capacitance. The motor 239 may be controlled by the controller 270.

The first measuring unit 272 may be disposed between the first electrode 240 and the first reactive element 234. The first measuring unit 272 may measure at least one of power, voltage, and current of the first electrode 240. The second measuring unit 274 may be disposed between the second electrode 250 and the second node N2. The second measuring unit 274 may measure at least one of power, voltage, and current of the second electrode 250. By calculating the power of the first electrode 240 and/or the power of the second electrode, the controller 270 may control the variable capacitor 236 through the motor 239 such that the set power is applied to the first electrode 240. In addition, the controller 270 may control the power distribution unit 230 and the RF power source 210 such that the set power, voltage or current is applied to the second electrode 250.

The first switch 276 may be disposed between the first electrode 240 and the first reactive element 234. The first switch 276 may be connected in series to the first measuring unit 272. The second switch 278 may be disposed between the second electrode 250 and the second node N2. The second switch 278 may be connected in series to the second measuring unit 274.

The controller 270 may control the first switch 276 may switch an electrical connection between the power distribution unit 230 and the first electrode 240. In addition, the controller 270 may control the second switch 278 to switch an electrical connection between the power distribution unit 230 and the second electrode 250.

An effective impedance ($Z_{eff}$=R+jX) viewing the first electrode 240 from the second node N2 is given by the Equation (1) below.

$$Z_{eff} = R + jX$$

$$= \frac{R_1 X_P^2}{R_1^2 + (X_1 + X_{S1} + X_P)^2} +$$

$$j\left[X_{S2} + \frac{X_P\{R_1^2 + (X_1 + X_{S1})(X_1 + X_{S1} + X_P)\}}{R_1^2(X_1 + X_{S1} + X_P)^2}\right]$$

Equation (1)

In the Equation (1), an impedance of the first electrode 240 is expressed as $Z_1$=$R_1$+j$X_1$, an impedance of the second electrode 250 is expressed as $Z_2$=$R_2$+j$X_2$, an impedance of a first reactive element 234 is expressed as j$X_{S1}$, an impedance of a second reactive element 232 is expressed as j$X_{S2}$, and an impedance of the variable capacitor 236 is expressed as j$X_P$. Also in the Equation (1), R represents a real part of the effective impedance $Z_{eff}$ and X represents an imaginary part thereof.

Figure 3:
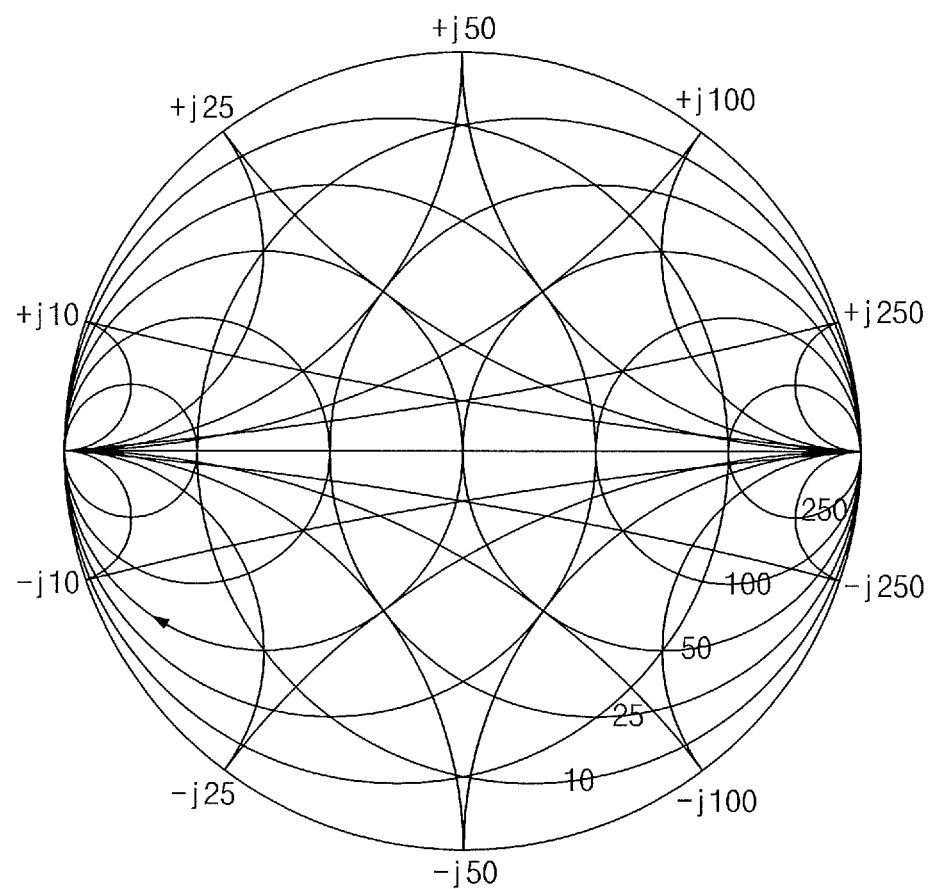
FIGS. 3 to 5 are the Smith charts of a power distribution device according to an embodiment of the present invention.
Figure 4:
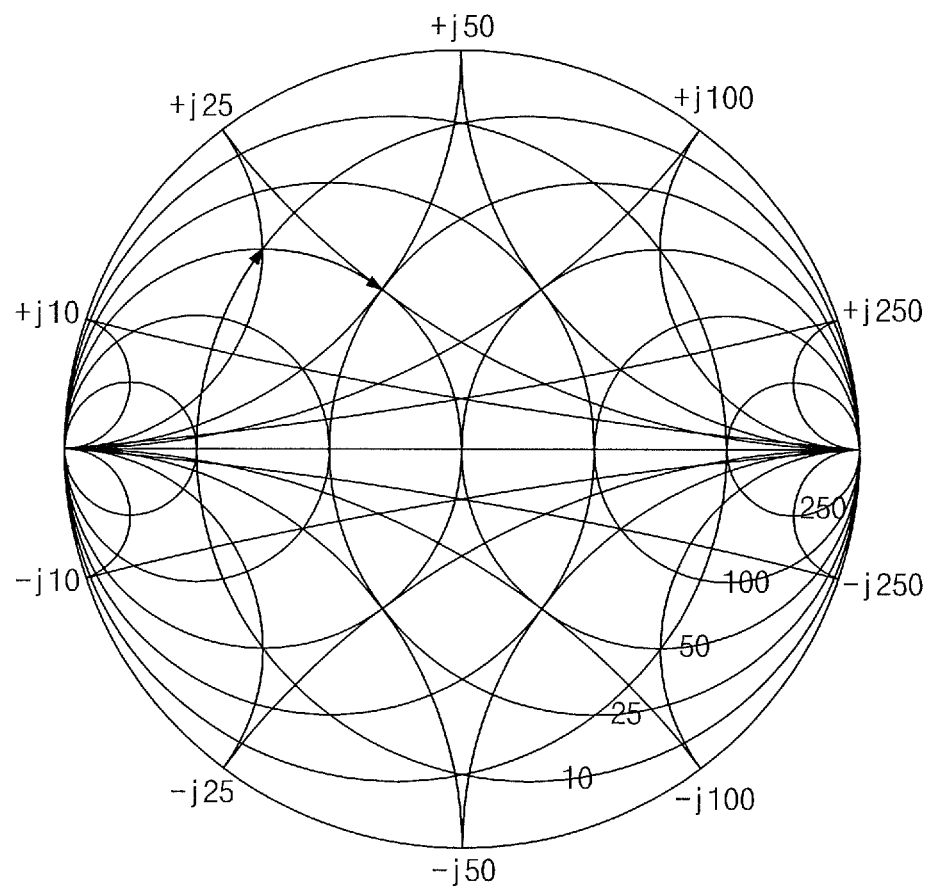
Figure 5:
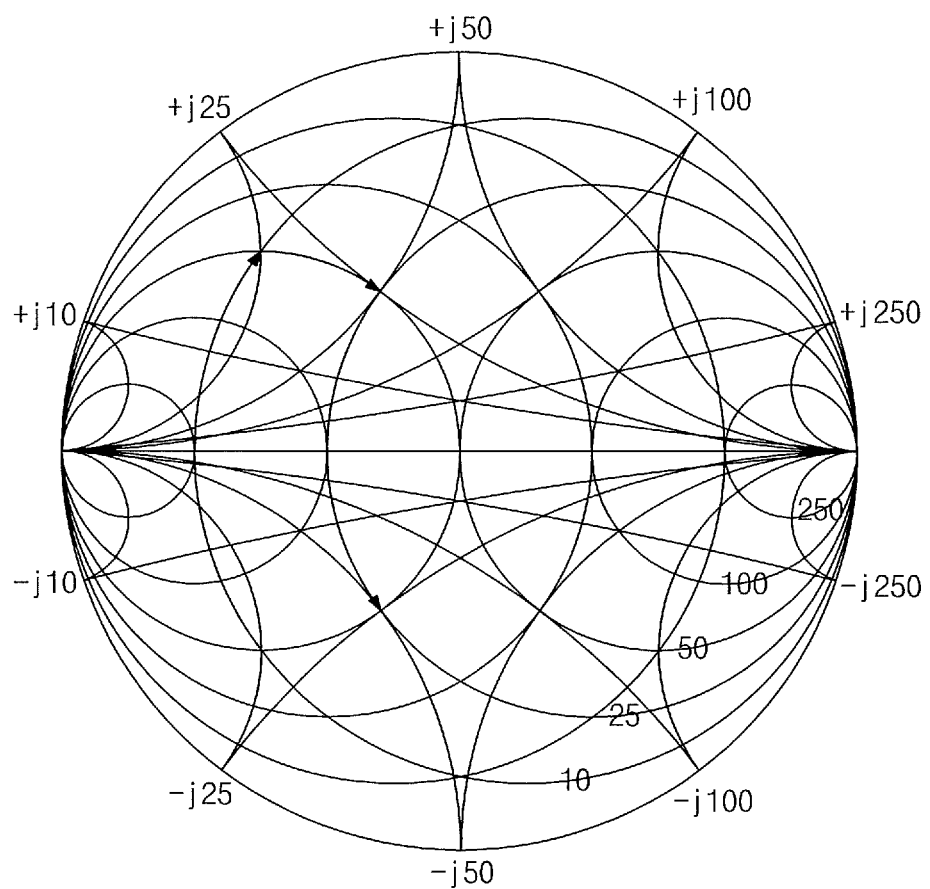

FIGS. 3 to 5 are the Smith charts illustrating impedance variation caused by a power distribution device according to an embodiment of the present invention.

In case of a large-area electrode, real resistance of a plasma load has a small value of about 0.1 ohm to about 1 ohm, which causes current to flow excessively. Thus, since a voltage applied to a matching circuit increases, stability of an impedance matching network and an apparatus is degraded. As a result, an inductor is preferably selected as the first reactive element 234 to increase real resistance of the overall impedance.

Referring to FIG. 3, when an imaginary part of the impedance sum of the first electrode 240 and the first reactive element 234 has a negative sign, the impedance variation caused by the variable capacitor 236 rotates clockwise on a constant conductance circle. Thus, real resistance of the impedance may be further reduced to cause worry about deteriorating the stable operation of an apparatus.

Referring to FIG. 4, the first reactive element 234 may employ an inductor such that an imaginary part of the impedance sum of the first electrode 240 and the first reactive element 234 has a positive sign. In this case, the impedance variation caused by the variable capacitor 236 may increase real resistance to stably operate an impedance matching network or the like.

The total impedance $Z_{12}$ viewed from an output terminal of the impedance matching network 220 may be a parallel connection between $Z_2$ and $Z_{eff}$. When impedances of imaginary parts of the $Z_2$ and $Z_{eff}$ have opposite signs, parallel resonance may occur. In this case, the impedance matching network 220 cannot perform impedance matching. However, as described above, if an imaginary part of the impedance sum of the first electrode 240, the first reactive element 234, and the variable capacitor 236 is adjusted to have a positive sign, the imaginary part of the impedance of the second electrode 250 has a negative sign and thus parallel resonance may occur.

Referring to FIG. 5, in order to avoid the parallel resonance, the second reactive element 232 must be decided as a capacitor of capacity where an imaginary part of $Z_{eff}$ has a negative sign.

Moreover, an element value is selected considering the fact that a power distribution ratio varies depending on values of the first reactive element 234 and the second reactive element 232. When $Z_{eff}$ is greater than $Z_2$, the total impedance $Z_{12}$ converges to the low impedance $Z_2$. Accordingly, the total impedance $Z_{12}$ becomes comparatively constant. This allows the impedance matching network 220 to stably operate in spite of impedance variation of the variable capacitor 236. That is, the power distribution unit 230 is designed such that $Z_{eff}$ is made much greater than $Z_2$. Hence, when the power distribution unit 230 does not distribute power, it is preferable that the power distribution unit 230 does not distribute power to the first electrode. The power distribution unit 230 may provide linearity of a current distribution ratio ($I_2/I_1$) according to the first and second reactive elements 234 and 232 and capacitance of the variable capacitor 236.

First current $I_1$ flowing through the first electrode 240 and second current $I_2$ flowing through the second electrode 250 are given by the equation (2) below.

$$|I_1|^2 = \frac{R}{R_1}\left(\frac{P|Z_2|^2}{R|Z_2|^2 + R_2|Z_{eff}|^2}\right)$$

$$|I_2|^2 = \left(\frac{p|Z_{eff}|^2}{R|Z_2|^2 + R_2|Z_{eff}|^2}\right)$$

$$\frac{|I_2|}{|I_1|} = \sqrt{\frac{R_1}{R}}\left(\frac{|Z_{eff}|}{|Z_2|}\right)$$

Equation (2)

In the equation (2), P represents incident power supplied through an impedance matching network.

The power distribution unit 230 may supply power to only the second electrode 250 or to both the first electrode 240 and the second electrode 250 at the same time. The power distribution ratio or the current distribution ratio ($I_2/I_1$) may be adjusted according to time.

Figure 6:
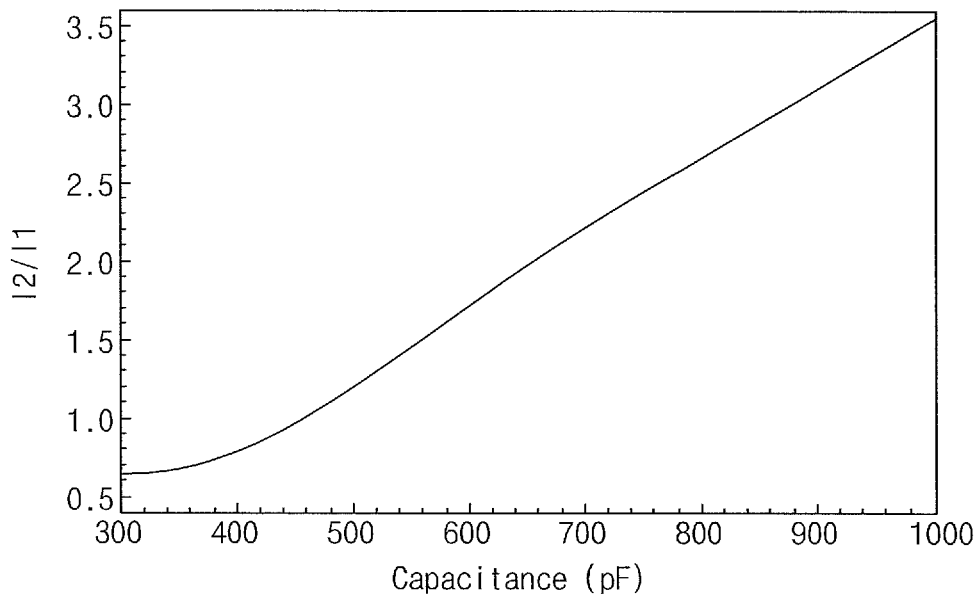
FIGS. 6 to 8 illustrate a power distribution rate, a real part of the total impedance, and an imaginary part of the total impedance of a power distribution device according to an embodiment of the inventive concept.
Figure 7:
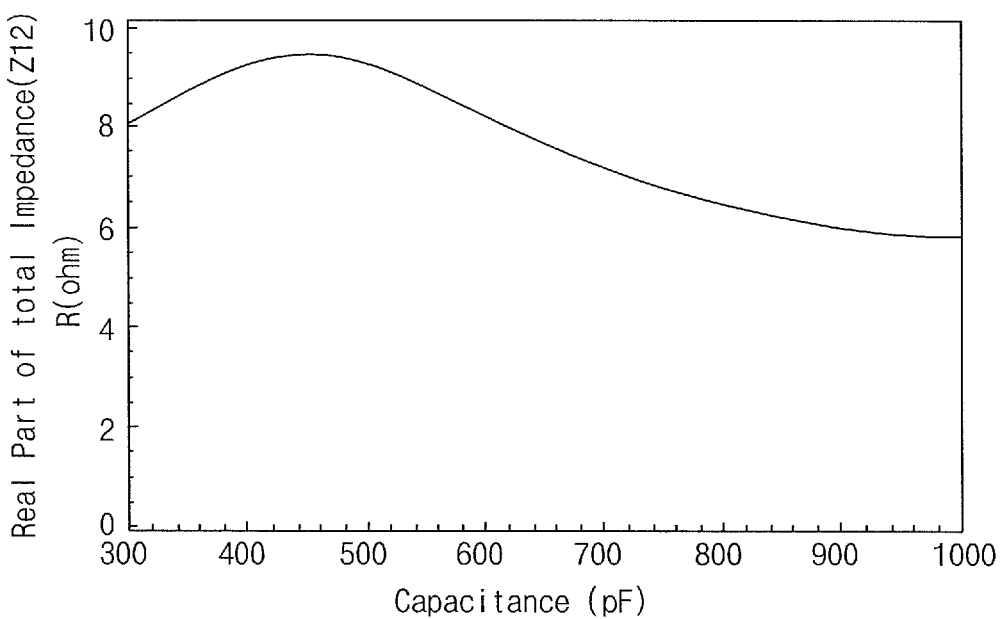
Figure 8:
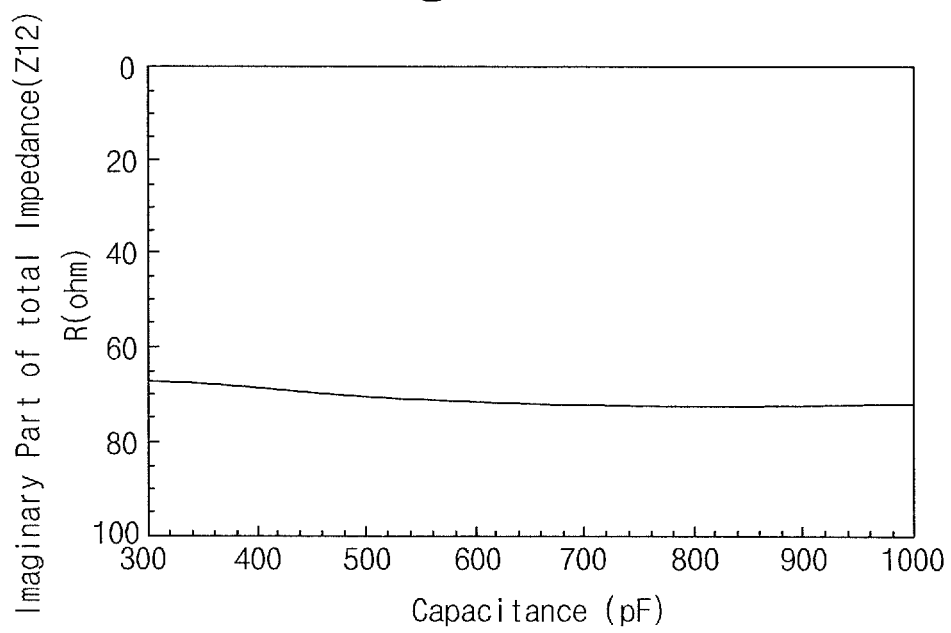

FIGS. 6 to 8 illustrate a current distribution rate, a real part of the total impedance, and an imaginary part of the total impedance of a power distribution device according to an embodiment of the inventive concept.

Referring to FIGS. 6 to 8, when a frequency of RF power is 13.56 MHz, an impedance of the first electrode 240 is (10-j100) ohms, an impedance of the second electrode 250 is (10-j100) ohms, a capacity value of the first reactive element 234 is 120 ohms, and a capacity value of the second reactive element 232 is −230 ohm, a current distribution ratio depending on the capacity of the variable capacitor 236 and a real part and an imaginary part of the total impedance $Z_{12}$ viewing from an output terminal of an impedance matching network are shown. As the capacity of the variable capacitor 236 varies from 300 pF to 1000 pF, the current ratio ($I_2/I_1$) varies within the range from 0.6 to 3.5. As the capacity of the variable capacitor 236 varies from 300 pF to 1000 pF, the real part of the total impedance $Z_{12}$ is comparatively constant near 8 ohms. In addition, as the capacitance of the variable capacitor 236 varies from 300 pF to 100 pF, the imaginary part of the total impedance $Z_{12}$ is comparatively constant near 70 ohms.

A first RF power source may apply power to a first electrode through a separate impedance matching network, and a second RF power source may apply power through a separate impedance matching network. In this case, since variation of the first RF power source has an effect on the second RF power source, the second RF power source cannot perform impedance matching within a short time. Thus, process stability is impaired.

However, since the total impedance $Z_{12}$ is comparatively constant in the power distribution device according to an embodiment of the present invention, the impedance matching is maintained to achieve a stable operation even under a condition where power is not applied to the first electrode 240 or varies depending on time.

According to modified embodiments of the present invention, a power distribution unit may extend to three or more loads connected in parallel to each other.

Figure 9:
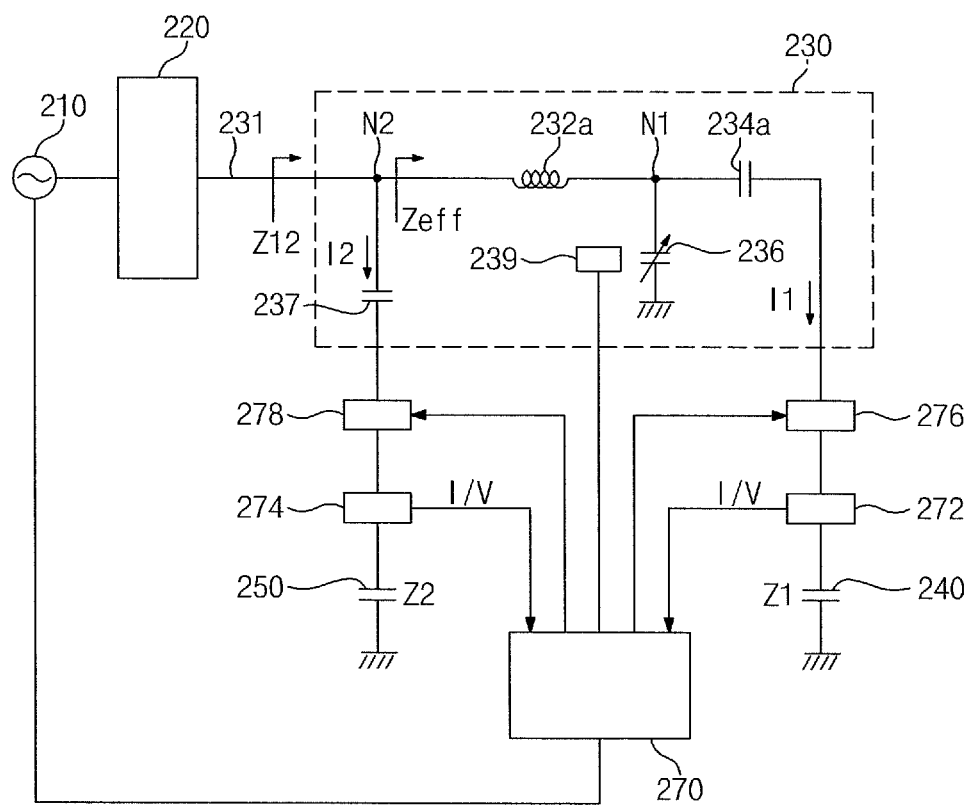
FIG. 9 illustrates a power distribution unit according to another embodiment of the present invention.

FIG. 9 illustrates a power distribution unit according to another embodiment of the present invention. Duplicate explanations with those in FIG. 2 will be omitted.

Referring to FIG. 9, the power distribution unit 230 includes a first reactive element 234a connected in series to the first electrode 240a, a variable capacitor 236 having one end connected in parallel to the first reactive element 234a and the first electrode 240 and the other end grounded, and a second reactive element 232a having one end connected to a first node N1 where one end of the variable capacitor 236 and one end of the first reactive element 234a are in contact with each other and the other end connected to a second node N2 where the second electrode 250 and an output terminal 331 of the impedance matching network are connected to each other. The first reactive element 234a may be a fixed capacitor, and the second reactive element 232a may be an inductor.

Returning to FIG. 3, in this embodiment, since the imaginary part of the impedance sum of the first electrode 240 and the first reactive element 234a is a negative number, the impedance variation caused by the variable capacitor 236 makes the real part small. Thus, current at an output terminal of the impedance matching network may increase to impair the stability of an apparatus. However, since a real part of plasma impedance is large enough (5 ohms to 50 ohms) in a conventional capacitively-coupled plasma apparatus for semiconductor, the capacitively-coupled plasma apparatus may be used without worry about increase in current.

Values of the first reactive element 234a and the second reactive element 232a are decided such that the impedances of imaginary parts of $Z_2$ and $Z_{eff}$ are all made negative to prevent parallel resonance of $Z_2$ and $Z_{eff}$.

Figure 10:
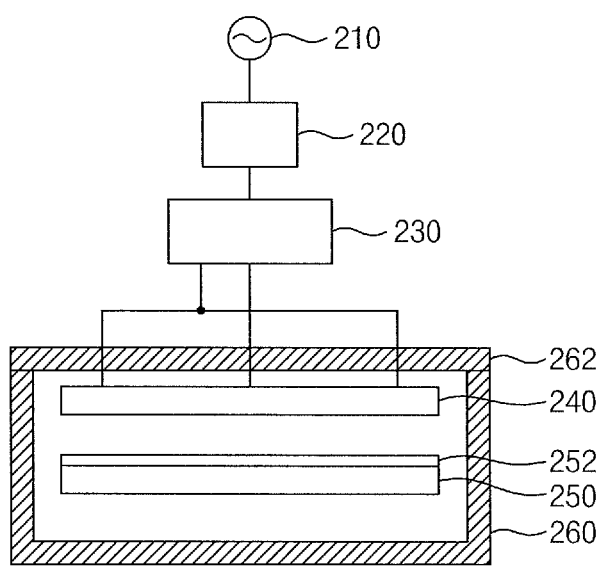
FIGS. 10 and 11 illustrate a power distribution device according to another embodiment of the present invention.
Figure 11:
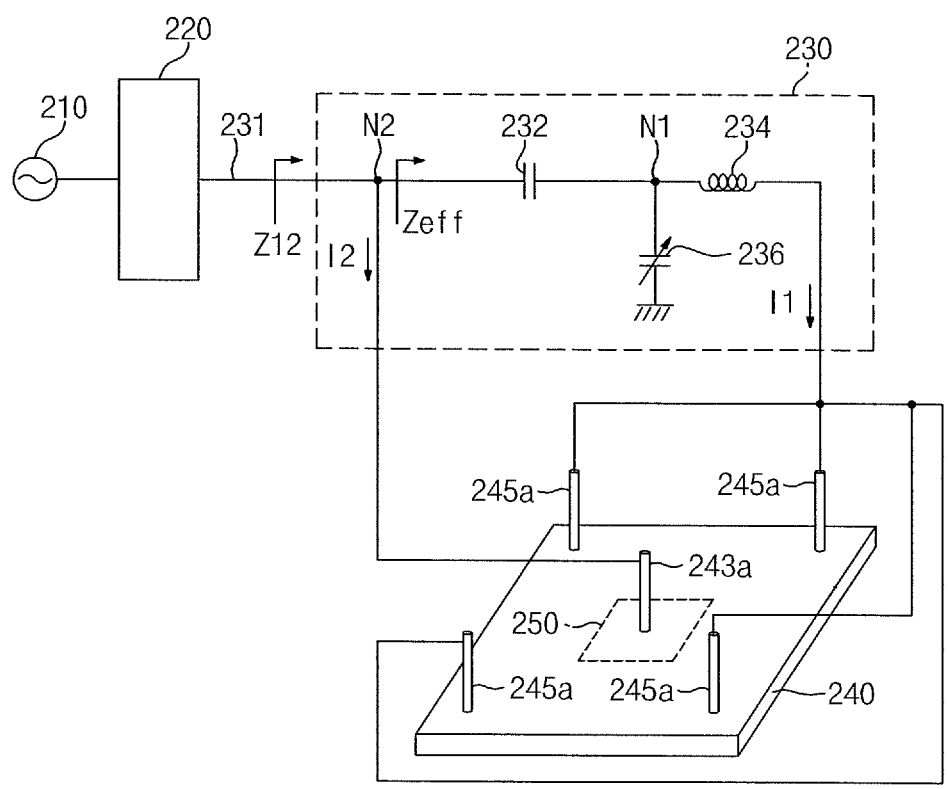

FIGS. 10 and 11 illustrate a power distribution device according to another embodiment of the present invention.

Referring to FIGS. 10 and 11, the power distribution device includes an impedance matching network 220 delivering power of an RF power source 210, and at least one of first and second electrodes 240 and 250 generating capacitively-coupled plasma, and a power distribution unit 230 distributing output power of the impedance matching network 220.

The power distribution unit 230 includes a first reactive element 234 connected in series to the first electrode 240, a variable capacitor 236 having one end connected in parallel to the first reactive element 234 and the first electrode 240 and the other end grounded, and a second reactive element 232 having one end connected to a first node N1 where one end of the variable capacitor 236 and one end of the first reactive element 234 are in contact with each other and the other end connected to a second node N2 where the second electrode 250 and an output terminal 231 of the impedance matching network 220 are connected to each other. The first reactive element 234 may be an inductor, and the second reactive element 232 may be a fixed capacitor.

The power distribution unit 230 may supply power at a plurality of positions of the first and second electrodes 240 and 250 that are electrically connected to each other. The first and second electrodes 240 and 250 may be electrically and physically connected to each other.

When the RF power 210 is high in frequency and an electrode is large in size, electric field intensity of the electrode may cause standing wave effect. That is, when power is supplied to the center of the electrode, an electric field at the center of the electrode and an electric field at the edge of the electrode may be different in phase and intensity. Thus, the electrode needs to receive the power at a plurality of positions to cancel out the standing wave effect. However, simply supplying power at a plurality of positions is limited in canceling out the standing wave effect. For this reason, supplying different powers at a plurality of positions according to the positions may enhance plasma uniformity or process uniformity.

Four first power supply lines 245a may be disposed at an edge portion of the first electrode 240, and a second power supply line 243a may be disposed at the center of the second electrode 250. The power supplied through the second power supply line 243a may be greater than that supplied through the first power supply line 245a.

Figure 12:
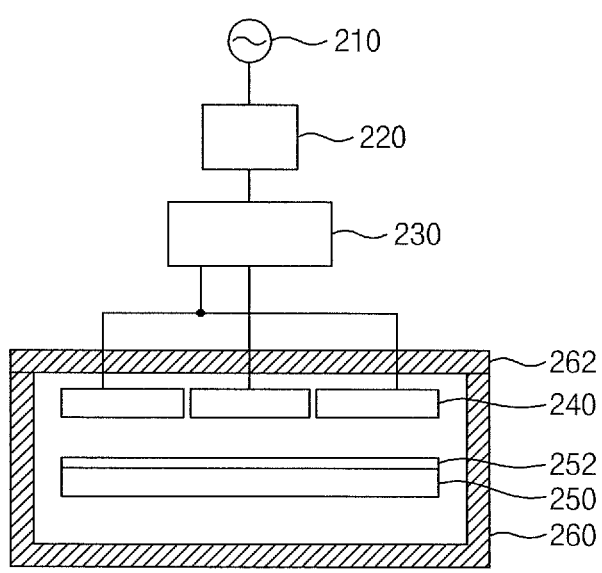
FIGS. 12 and 13 illustrate a power distribution device according to another embodiment of the present invention.
Figure 13:
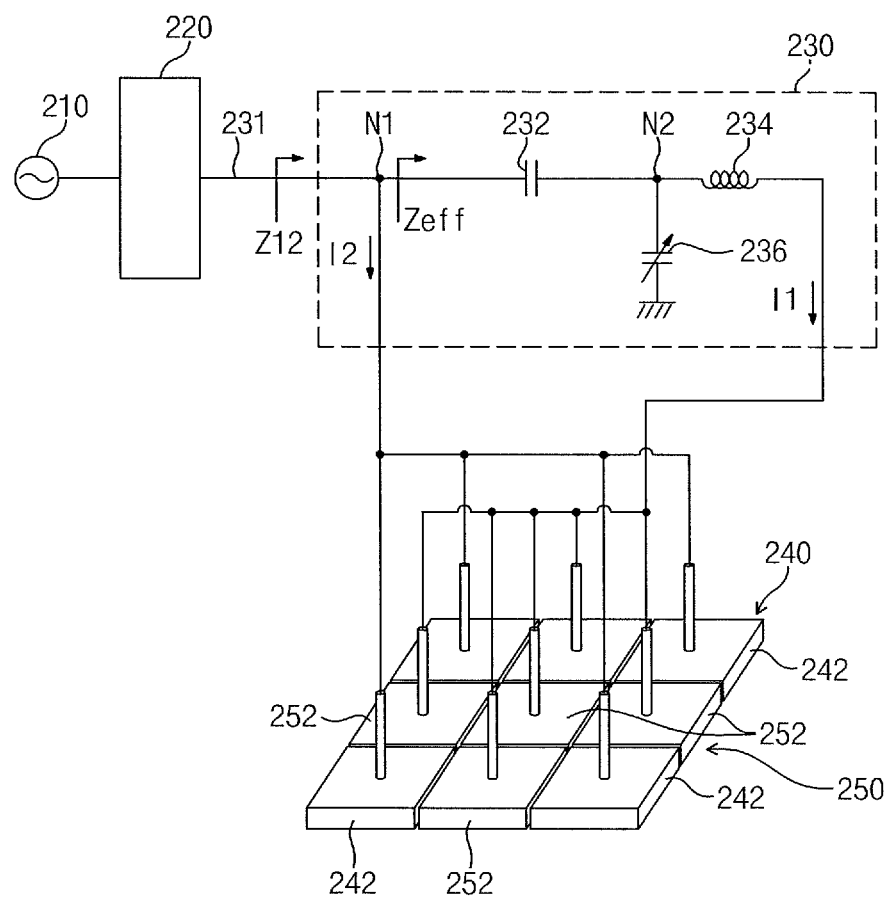

FIGS. 12 and 13 illustrate a power distribution device according to another embodiment of the present invention.

Referring to FIGS. 12 and 13, the power distribution device includes an impedance matching network 220 delivering power of an RF power source 210 and a power distribution unit 230 distributing output power of the impedance matching network 220 to at least one electrode generating capacitively-coupled plasma. The power distribution unit 230 includes a first reactive element 234 connected in series to the first electrode 240, a variable capacitor 236 having one end connected in parallel to the first reactive element 234 and a first electrode 240 and the other end grounded, and a second reactive element 232 having one end connected to a first node N1 where one end of the variable capacitor 236 and one end of the first reactive element 234 are in contact with each other and the other end connected to a second node N2 where a second electrode 250 and an output 231 of the impedance matching network 220 are connected to each other.

The first electrode 240 and the second electrode 250 are disposed adjacent to each other on the same plane. The first electrode 240 and/or the second electrode 250 may be divided into sub-electrodes 242 and 252, respectively. The power distribution unit 230 distributes power to the first electrode 240 and the second electrode 250. The sub-electrodes 242 constituting the first electrode 240 may be connected in parallel to each other, and the sub-electrodes 252 constituting the second electrode 250 may be connected in parallel to each other.

For example, in an electrode structure where electrodes are arranged in a 3×3 square, the first electrode 240 may be disposed at a corner portion and the second electrode 250 may be disposed crosswise. The first electrode 240 may include first to fourth sub-electrodes 242, and the second electrode 250 may include first to fifth sub-electrodes 252. A space between the sub-electrodes may be filled with an insulator.

Plasma density uniformity and process uniformity may be enhanced depending on the power supplied to the first electrode 240 and the second electrode 250. The first electrode 240 and/or the second electrode 250 may further include a gas distribution unit. In order to increase plasma density, the first electrode 240 and/or the second electrode 250 may include holes (not shown) and/or trenches (not shown) for hollow cathode discharge.

Figure 14:
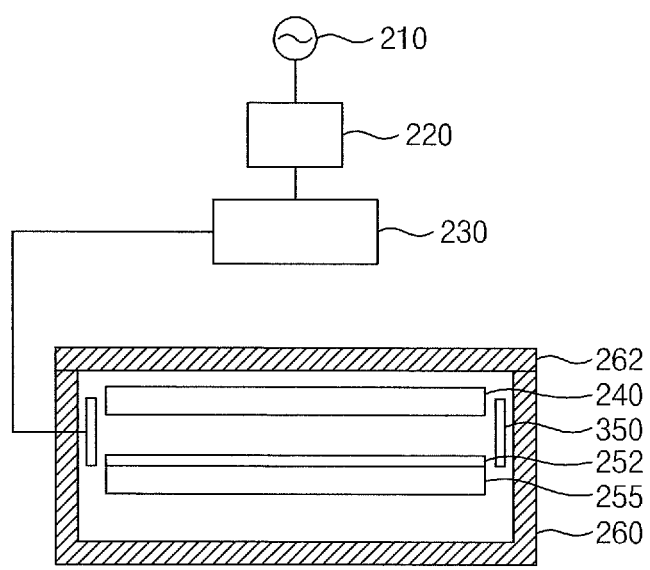
FIGS. 14 to 16 illustrate a power distribution device according to other embodiments of the present invention.

FIG. 14 illustrates a power distribution device according to another embodiment of the present invention.

Referring to FIG. 14, the power distribution device includes an impedance matching network 220 delivering power of an RF power source 210 and a power distribution unit 230 distributing output power of the impedance matching network 220 to at least one electrode generating capacitively-coupled plasma.

The power distribution unit 230 includes a first reactive element 234 connected in series to the first electrode 240, a variable capacitor 236 having one end connected in parallel to the first reactive element 234 and a first electrode 240 and the other end ground, and a second reactive element 232 having one end connected to a first node N1 where one end of the variable capacitor 236 and one end of the first reactive element 234 are in contact with each other and the other end connected to a second node N2 where a second electrode 350 and an output of the impedance matching network 220 are connected to each other.

The second electrode 350 may disposed on the inner sidewall of a vacuum container 260, and the power distribution unit 230 may distribute power to the first electrode 240 and the second electrode 350.

The first electrode 240 may be disposed opposite to a substrate holder 255 on which a substrate 252 is mounted. The second electrode 350 may be disposed adjacent to the inner sidewall of the vacuum container 260. The second electrode 350 may be used to enhance plasma uniformity when a plasma process is performed. Also the second electrode 350 may be used when a cleaning process of the vacuum container 260 is performed.

Figure 15:
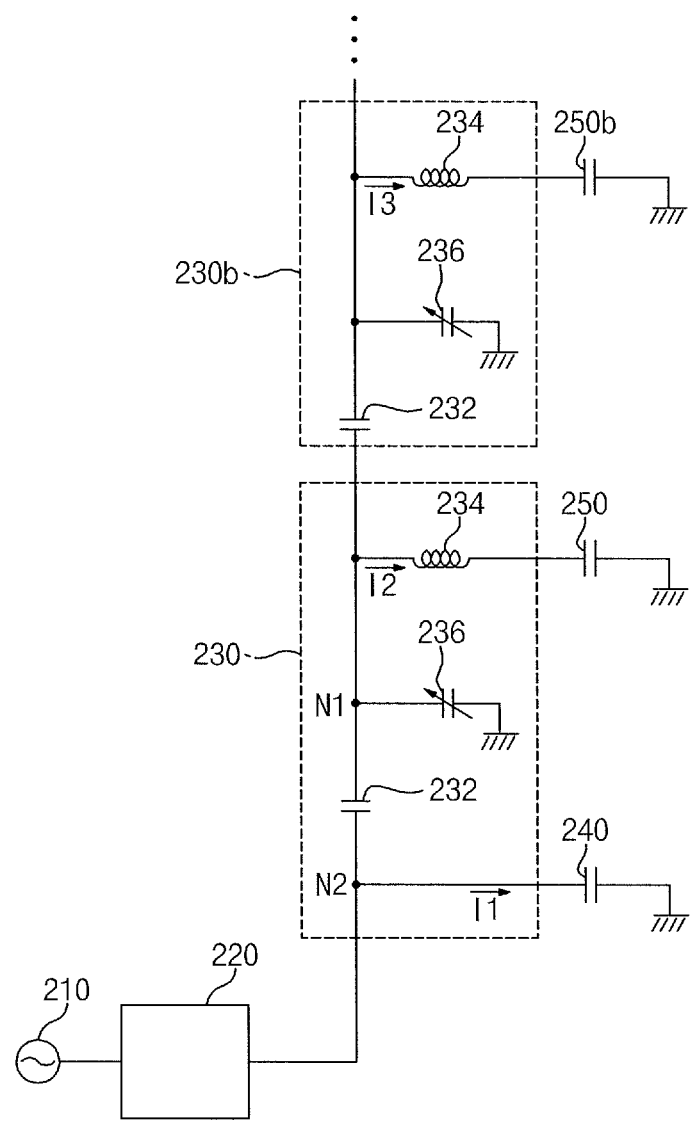

FIG. 15 illustrates a power distribution device according to another embodiment of the present invention.

Referring to FIG. 15, the power distribution device may further include a third electrode 250b and an auxiliary power distribution unit 230b distributing power to the third electrode 250b. The auxiliary power distribution unit 230b may draw out power from a first node N1 of the power distribution unit 230. The auxiliary power distribution unit 230b has the same configuration as the power distribution unit 230.

Figure 16:
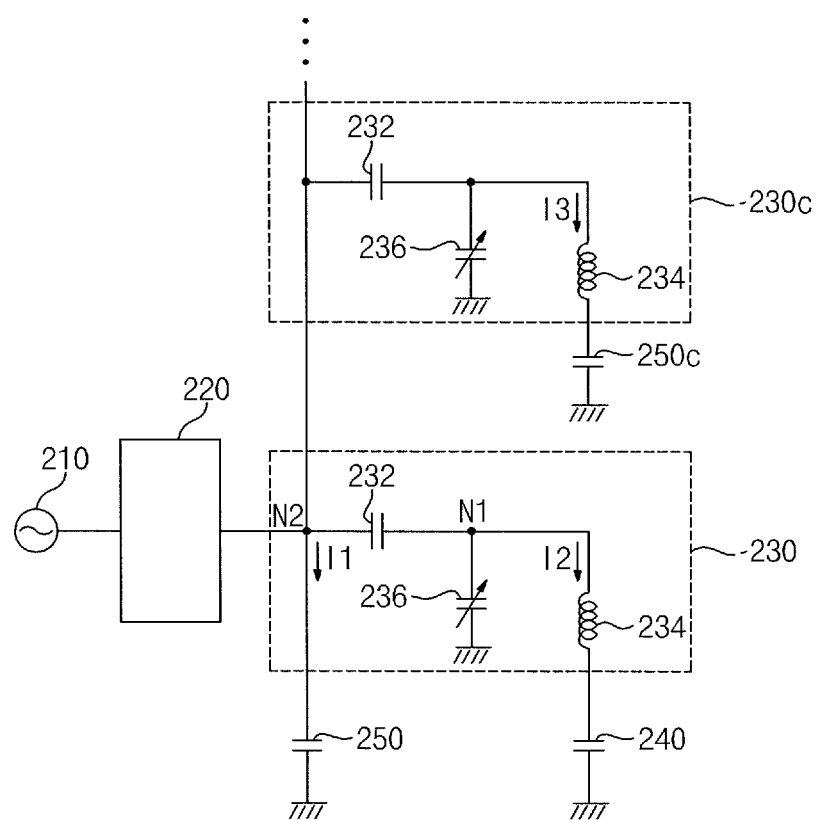

FIG. 16 illustrates a power distribution device according to another embodiment of the present invention.

Referring to FIG. 16, the power distribution device may further include a third electrode 250c and an auxiliary power distribution unit 230c distributing power to the third electrode 250c. The auxiliary power distribution unit 230c may draw out power from a second node N2 of the power distribution unit 230. The auxiliary power distribution unit 230s may have the same configuration as the power distribution unit 230.

Figure 17:
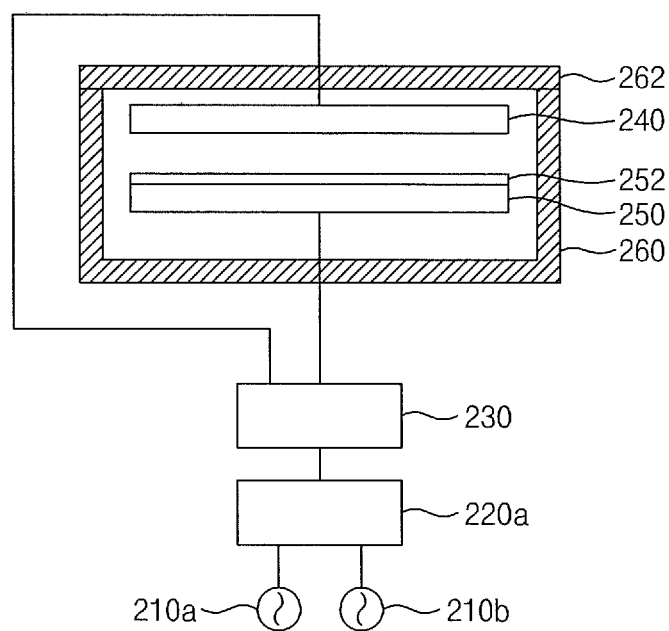
FIGS. 17 and 18 illustrate a power distribution device according to another embodiment of the present invention.
Figure 18:
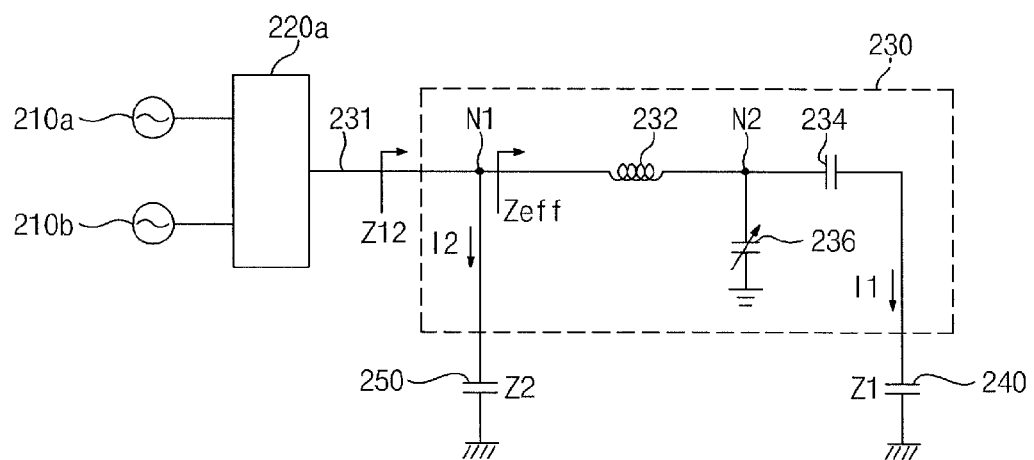

FIGS. 17 and 18 illustrate a power distribution device according to another embodiment of the present invention.

Referring to FIGS. 17 and 18, the power distribution device includes a dual-frequency impedance matching network 220a delivering powers of RF power sources 210a and 210b and a power distribution unit 230 distributing output power of the impedance matching network 220a to at least one electrode generating capacitively-coupled plasma.

The power distribution unit 230 includes a first reactive element 234 connected in series to a first electrode 240, a variable capacitor 236 having one end connected in parallel to the first reactive element 234 and the first electrode 240 and the other end ground, and a second reactive element 232 having one end connected to a first node N1 where one end of the variable capacitor 236 and one end of the first reactive element 234 are in contact with each other and the other end connected to a second node N2 where the second electrode 250 and an output terminal of the impedance matching network 220a are connected to each other.

The RF power sources 210a and 210b may include a low-frequency RF power source 220a outputting a low frequency and a high-frequency RF power source 220b outputting a high frequency. Outputs of the low-frequency RF power source 220a and the high-frequency RF power source 220b are provided to the impedance matching network 220a. A plurality of RF power sources having different frequencies may adjust a DC bias voltage while improving plasma density.

The first electrode 240 and the second electrode 250 are disposed opposite to each other. A substrate 252 may be mounted on the second electrode 250. The power distribution unit 230 may distribute power to the first electrode 240 and the second electrode 250.

A power distribution ratio of the first RF power source 210a and a power distribution ratio of the second RF power source 210b depending on the variable capacitor 236 of the power distribution unit 230 may be different from each other.

Figure 19:
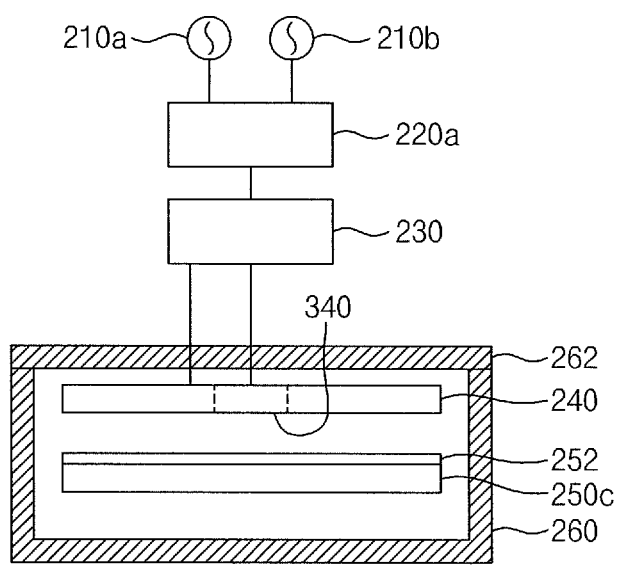
FIGS. 19 and 20 illustrate power distribution devices according to another embodiment of the present invention.

FIG. 19 illustrates a power distribution device according to another embodiment of the present invention. Duplicate explanations with those in FIG. 18 will be omitted.

Referring to FIG. 19, a power distribution unit 230 supplies power at a plurality of positions of a first electrode 240 and a second electrode 340 that are electrically connected to each other. A ratio of the power supplied to the first electrode 240 to the power supplied to the second electrode 340 may be different depending on a frequency. A substrate 252 may be mounted on a substrate holder 250c.

Figure 20:
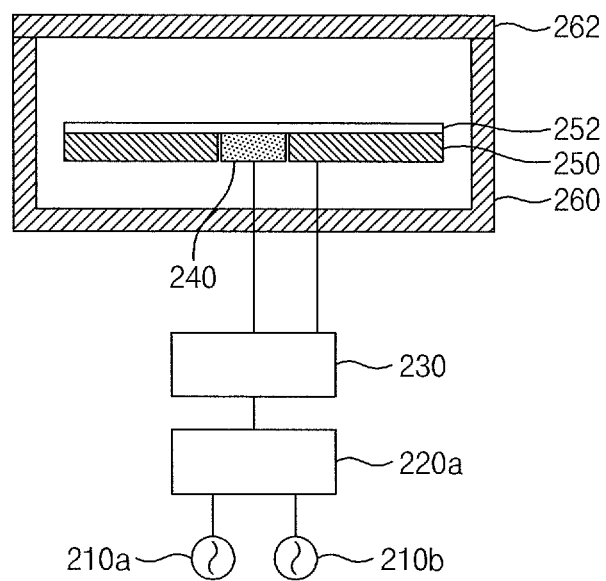

FIG. 20 illustrates a power distribution device according to another embodiment of the present invention. Duplicate explanations with those in FIG. 18 will be omitted.

Referring to FIG. 20, a first electrode 240 and a second electrode 250 are disposed adjacent to each other on the same plane. The first electrode 240 or the second electrode 250 may be divided into sub-electrodes. A power distribution unit 220a distributes power to the first electrode 240 and the second electrode 250.

Figure 21:
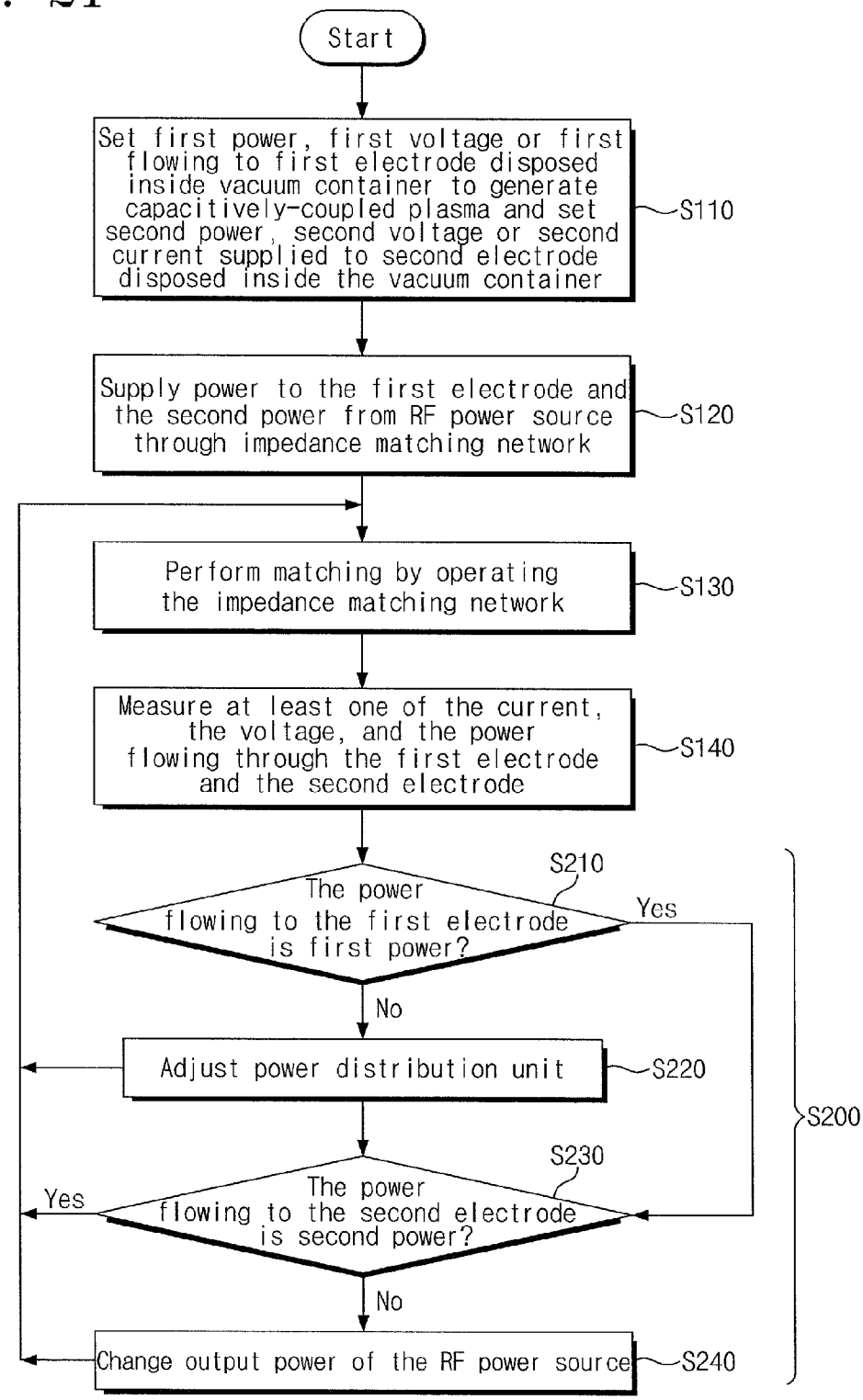
FIG. 21 is a flowchart illustrating a power distribution method according to an embodiment of the present invention.

FIG. 21 is a flowchart illustrating a power distribution method according to an embodiment of the present invention.

Referring to FIGS. 1 and 21, the power distribution method include setting first power, a first voltage or first current flowing to the first electrode 240 disposed inside the vacuum container 260 to generate capacitively-coupled plasma and setting second power, a second voltage or second current supplied to a second electrode 250 disposed inside the vacuum container (S110), supplying power to the first electrode 240 and the second electrode 250 from RF power source 210 through the impedance matching network 220 (S120), performing matching by operating the impedance matching network 220 (S130), measuring at least one of the current, the voltage, and the power flowing through the first electrode 240 and the second electrode 250 (S140), and controlling the set power, the set voltage or the set current to be supplied to the first electrode 240 and the second electrode 250 by using the power distribution unit 230 (S200).

The step of controlling the set power, the set voltage or the set current to be supplied to the first electrode 240 and the second electrode 250 (S250) includes comparing power flowing to the first electrode 240 with first power (S210), adjusting the power distribution unit 230 (S220), comparing power flowing to the second electrode 250 with second power (S230), and changing output power of the RF power source 210 (S240). The RF power source 210 may be a plurality of RF power sources having different frequencies.

As described above, an RF power distribution device according to embodiments of the present invention includes one RF power source and one impedance matching network. The RF power distribution device can prevent mutual interference between RF power sources and stably distribute RF power to a plurality of electrodes. Moreover, since the total impedance is comparatively constant in spite of change of a power distribution, the impedance matching network can stably operate.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A power distribution device comprising:
   an impedance matching network configured to deliver power from an RF power source; and
   a power distribution unit configured to distribute the output power from the impedance matching network to at least one electrode generating capacitively-coupled plasma,
   wherein the power distribution unit comprises:
      a first reactive element connected in series to a first electrode;
      a variable capacitor having one end connected to one end of the first reactive element and the other end grounded;
      a second reactive element having one end connected to a first node where the one end of the variable capacitor and one end of the first reactive element are in contact with each other and the other end connected to a second node where a second electrode and an output terminal of the impedance matching network are connected; and
      an auxiliary fixed capacitor provided between the second node and the second electrode;
      wherein the power distribution unit distributes power to the first electrode and the second electrode and is linearly varied depending on the capacity of the variable capacitor.

2. The power distribution device as set forth in claim 1, wherein the power distribution unit supplies power at a plurality of positions of the first electrode and the second electrode that are electrically connected to each other.

3. The power distribution device as set forth in claim 1, wherein the first electrode and the second electrode are disposed opposite to each other,
   wherein a substrate is mounted on the second electrode, and
   wherein the power distribution unit distributes power to the first electrode and the second electrode.

4. The power distribution device as set forth in claim 1, wherein the first electrode and the second electrode are disposed adjacent to each other on the same plane, and the first electrode or the second electrode is divided into sub-electrodes, and
   wherein the power distribution unit distributes power to the first electrode and the second electrode.

5. The power distribution device as set forth in claim 1, wherein the first reactive element is an inductor, and the second reactive element is a fixed capacitor.

6. The power distribution device as set forth in claim 1, wherein the first reactive element is a fixed capacitor, and the second reactive element is an inductor.

7. The power distribution device as set forth in claim 1, wherein the second electrode is disposed adjacent to an inner sidewall of a vacuum container, and
   wherein the power distribution unit distributes power to the first electrode and the second electrode.

8. The power distribution device as set forth in claim 1, further comprising:
   a measuring unit configured to measure at least one of power, current, and a voltage of a load of the electrode; and
   a controller configured to receive an output of the measuring unit and control the power distribution unit and the RF power source to control a ratio of the power or current flowing to the electrode.

9. The power distribution device as set forth in claim 1, further comprising:
   a switch connected in series to the electrode and configured to switch the power supplied to the electrode.

10. The power distribution device as set forth in claim 1, wherein the electrode include a substrate holder on which a substrate is mounted.

11. The power distribution device as set forth in claim 1, wherein the RF power source includes a low-frequency RF power source outputting a low frequency and a high-frequency RF power source outputting a high frequency, and
    wherein outputs of the low-frequency RF power source and the high-frequency RF power source are provided to the impedance matching network.

12. The power distribution device as set forth in claim 11, wherein the power distribution unit supplies power at a plurality of positions of the first electrode and the second electrode that are electrically connected to each other.

13. The power distribution device as set forth in claim 11, wherein the first electrode and the second electrode are disposed opposite to each other,
    wherein a substrate is mounted on the second electrode, and
    wherein the power distribution unit distributes power to the first electrode and the second electrode.

14. The power distribution device as set forth in claim 11, wherein the first electrode and the second electrode are disposed adjacent to each other on the same plane, and the first electrode or the second electrode is divided into sub-electrodes, and
    wherein the power distribution unit distributes power to the first electrode and the second electrode.

* * * * *